United States Patent
Soh et al.

(10) Patent No.: US 12,029,141 B1
(45) Date of Patent: Jul. 2, 2024

(54) SYSTEMS AND METHODS FOR RESOLVING A NUMBER OF INCIDENT RF-RANGE PHOTONS

(71) Applicant: National Technology & Engineering Solutions of Sandia, LLC, Albuquerque, NM (US)

(72) Inventors: Daniel Beom Soo Soh, Pleasanton, CA (US); Wei Pan, San Ramon, CA (US); Eric Chatterjee, Sammamish, WA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 340 days.

(21) Appl. No.: 17/461,438

(22) Filed: Aug. 30, 2021

(51) Int. Cl.
*H10N 60/84* (2023.01)
*H10N 60/85* (2023.01)

(52) U.S. Cl.
CPC ............ *H10N 60/84* (2023.02); *H10N 60/855* (2023.02)

(58) Field of Classification Search
None
See application file for complete search history.

(56) References Cited

U.S. PATENT DOCUMENTS

| | | | | |
|---|---|---|---|---|
| 4,464,065 A * | 8/1984 | Wolf | ............... | G01J 5/20 374/176 |
| 4,851,680 A * | 7/1989 | Oku | ............... | H10N 60/12 250/370.15 |
| 4,869,598 A * | 9/1989 | McDonald | ............... | H10N 60/84 374/176 |
| 5,381,001 A * | 1/1995 | Perryman | ............... | H10N 60/10 505/848 |
| 5,521,862 A * | 5/1996 | Frazier | ............... | G11C 11/44 257/38 |

(Continued)

OTHER PUBLICATIONS

Chatterjee, et al., "Microwave Photon Number Resolving Detector Using the Topological Surface State of Superconducting Cadmium Arsenide", In Physical Review Research, vol. 3, Issue 2, Apr. 15, 2021, 17 Pages.

(Continued)

*Primary Examiner* — David P Porta
*Assistant Examiner* — Djura Malevic
(74) *Attorney, Agent, or Firm* — Calfee, Halter & Griswold LLP; Samantha Updegraff

(57) ABSTRACT

A photon-number-resolving detector comprises a detection element, an ohmmeter, and a hardware logic component. The detection element can be formed from a Weyl or Dirac semimetal. Electrons of the detection element are characterized by a surface state that exhibits a Dirac cone and a bulk superconducting state that exhibits a bandgap. When photons having energies less than the bandgap of the bulk superconducting state impinges on the detection element, the photons can be absorbed by electrons of the detection element that are characterized by the surface state. The ohmmeter outputs resistance data indicative of an electrical resistance of the detection element while the photons impinge on the detection element. The hardware logic component can determine, based upon the resistance data, a number of the photons that are absorbed by the surface state electrons of the detection element.

20 Claims, 7 Drawing Sheets

(56) References Cited

U.S. PATENT DOCUMENTS

| | | | | |
|---|---|---|---|---|
| 5,600,172 A * | 2/1997 | McDevitt | G01K 7/006 | |
| | | | 374/E7.003 | |
| 5,641,961 A * | 6/1997 | Irwin | G01T 1/1606 | |
| | | | 250/336.2 | |
| 5,880,468 A * | 3/1999 | Irwin | G01B 11/0616 | |
| | | | 374/176 | |
| 6,211,519 B1 * | 4/2001 | Nam | G01K 7/006 | |
| | | | 374/E7.003 | |
| 6,455,849 B1 * | 9/2002 | Hilton | H10N 60/84 | |
| | | | 374/E7.003 | |
| 7,763,854 B2 * | 7/2010 | Frey | G01J 1/0209 | |
| | | | 250/336.2 | |
| 8,393,786 B2 * | 3/2013 | Sadleir | G01K 3/005 | |
| | | | 374/100 | |
| 8,478,373 B2 * | 7/2013 | Brandt | G02F 1/31 | |
| | | | 505/181 | |
| 8,674,302 B2 * | 3/2014 | Sadleir | G01K 3/005 | |
| | | | 250/336.2 | |
| 8,736,085 B2 * | 5/2014 | Sines | H02N 11/002 | |
| | | | 290/1 R | |
| 8,872,109 B2 * | 10/2014 | Ohkubo | H10N 60/84 | |
| | | | 250/336.2 | |
| 9,882,113 B1 * | 1/2018 | Henry | H01J 37/3056 | |
| 10,090,466 B2 * | 10/2018 | Chan | H10N 99/03 | |
| 10,197,440 B2 * | 2/2019 | Najafi | G01J 5/20 | |
| 10,361,703 B2 * | 7/2019 | Najafi | H01L 23/552 | |
| 10,386,229 B2 * | 8/2019 | Najafi | G01J 1/44 | |
| 10,461,445 B2 * | 10/2019 | Najafi | H03K 19/195 | |
| 10,566,516 B2 * | 2/2020 | Najafi | H01L 29/437 | |
| 10,573,800 B1 * | 2/2020 | Najafi | H10N 60/84 | |
| 10,586,910 B2 * | 3/2020 | Najafi | H10N 60/35 | |
| 10,620,044 B2 * | 4/2020 | Thompson | G01J 1/0425 | |
| 10,944,038 B2 * | 3/2021 | Najafi | H10N 60/207 | |
| 11,283,001 B2 * | 3/2022 | Najafi | G01J 1/44 | |
| 11,473,974 B2 * | 10/2022 | Thompson | G01J 1/42 | |
| 11,585,695 B1 * | 2/2023 | Najafi | G01J 1/44 | |
| 11,719,653 B1 * | 8/2023 | Najafi | C23C 14/0641 | |
| 2001/0000335 A1 | 4/2001 | Yamada | H01L 33/0054 | |
| | | | 438/1 | |
| 2001/0042831 A1 * | 11/2001 | Wood | G01J 5/12 | |
| | | | 338/18 | |
| 2003/0087503 A1 * | 5/2003 | Sakaguchi | H01L 21/3226 | |
| | | | 257/E21.32 | |
| 2003/0102470 A1 * | 6/2003 | Il'ichev | H10N 60/0941 | |
| | | | 257/31 | |
| 2005/0153843 A1 * | 7/2005 | Kubota | H10N 60/30 | |
| | | | 505/100 | |
| 2010/0123120 A1 * | 5/2010 | Mohseni | H01L 27/14643 | |
| | | | 977/936 | |
| 2010/0304977 A1 * | 12/2010 | Sadleir | H10N 60/84 | |
| | | | 29/599 | |
| 2010/0327163 A1 * | 12/2010 | Sadleir | G01K 3/005 | |
| | | | 250/336.2 | |
| 2011/0003279 A1 * | 1/2011 | Patel | G01D 7/005 | |
| | | | 436/1 | |
| 2011/0174084 A1 * | 7/2011 | West | H01M 10/445 | |
| | | | 324/157 | |
| 2011/0287940 A1 * | 11/2011 | Brandt | G02F 1/3556 | |
| | | | 356/73 | |
| 2015/0143817 A1 * | 5/2015 | Gervais | H01L 23/3738 | |
| | | | 62/3.1 | |
| 2016/0080667 A1 * | 3/2016 | Stuart | H04N 23/11 | |
| | | | 348/135 | |
| 2017/0086281 A1 * | 3/2017 | Avrahamy | H05B 47/19 | |
| 2018/0335343 A1 * | 11/2018 | Najafi | H01L 29/02 | |
| 2018/0364097 A1 * | 12/2018 | Najafi | H10N 60/0184 | |
| 2018/0366633 A1 * | 12/2018 | Fu | H10N 60/80 | |
| 2019/0109595 A1 * | 4/2019 | Najafi | H10N 60/124 | |
| 2019/0323886 A1 * | 10/2019 | Thompson | G01J 1/0407 | |
| 2020/0041431 A1 * | 2/2020 | Herman | G01N 25/68 | |
| 2020/0287549 A1 * | 9/2020 | Najafi | H03K 19/195 | |
| 2020/0294401 A1 * | 9/2020 | Kerecsen | G05D 1/0287 | |
| 2021/0043824 A1 * | 2/2021 | Yan | H10N 60/203 | |
| 2021/0083133 A1 * | 3/2021 | Efetov | H10N 60/30 | |
| 2021/0138232 A1 * | 5/2021 | Paz | A61N 1/36021 | |
| 2021/0190584 A1 * | 6/2021 | Thompson | H10N 60/84 | |
| 2022/0393089 A1 * | 12/2022 | Yohannes | H10N 60/0912 | |
| 2023/0125317 A1 * | 4/2023 | Zheng | G01J 1/44 | |
| | | | 356/218 | |
| 2023/0307153 A1 * | 9/2023 | Yushin | C04B 35/62231 | |
| | | | 556/170 | |

OTHER PUBLICATIONS

Divochiy, et al., "Superconducting nanowire photon number resolving detector at telecom wavelength", In Nature Photonics, vol. 2, Issue 5, Apr. 13, 2008, 16 Pages.

Kardynal, et al., "An avalanche-photodiode-based-photon-number-resolving detector", In Nature Photonics, vol. 2, Issue 7, Jun. 15, 2008, 12 Pages.

Rosenberg, et al., "Noise-free high-efficiency photon-number-resolving detectors", In Physical Review A, vol. 71, Issue 6, Jun. 17, 2005, 4 Pages.

* cited by examiner

SYSTEMS AND METHODS FOR RESOLVING A NUMBER OF INCIDENT RF-RANGE PHOTONS

STATEMENT OF GOVERNMENTAL INTEREST

This invention was made with Government support under Contract No. DE-NA0003525 awarded by the United States Department of Energy/National Nuclear Security Administration. The U.S. Government has certain rights in the invention.

BACKGROUND

In quantum computers, information is encoded on qubits that exhibit probabilities of being in one of various physical states. Physically, these qubits can be realized in various ways. Among these physical instantiations of qubits are superconducting qubits implemented using Josephson junctions. These qubits are characterized by a ground state and an excited state. The energy difference between the ground state and the excited state of superconducting transmon qubits is generally in the radio frequency (RF) range. For example, in some embodiments of superconducting transmon qubits, the oscillation frequency of the transmons is between about 5 and about 7 GHZ, translating to an energy of about 0.03 meV. While devices that are considered to be single photon detectors have been demonstrated, these devices are generally configured to detect photons with energies in the optical frequency range, or greater than or equal to about 12.5 meV. Typically, these optical photon detectors are not suited to detecting RF-range photons.

SUMMARY

The following is a brief summary of subject matter that is described in greater detail herein. This summary is not intended to be limiting as to the scope of the claims.

Technologies pertaining to a device for detecting a number of incident RF-range photons are described herein. In an exemplary embodiment, a photon-number detection device comprises a detection element, a cooling device, and a micro-ohmmeter. The cooling device is configured to cool the detection element to a temperature sufficiently low to cause a bulk of the detection element to exhibit a superconducting state. In exemplary embodiments, the detection element is composed of a Dirac semimetal such as, but not limited to, cadmium arsenide ($Cd_3As_2$). In these embodiments, the cooling device can be configured to cool the detection element to a parking temperature of between 0.35 K and 0.45 K prior to incidence of photons.

The detection element is configured such that, when the bulk of the detection element is in the superconducting state, electrons proximal to a surface of the detection element are characterized by a surface state that is distinct from the superconducting state. In exemplary embodiments, the surface state is characterized by a Dirac cone electron energy band structure, wherein the conduction band and the valence band intersect at a Dirac point. By contrast, the superconducting electron state of the bulk of the detection element exhibits a non-zero bandgap between the conduction band and the valence band. As a result, the surface state electrons of the detection element readily absorb RF-range photons, while the electrons of the bulk of the detection element do not absorb photons that have energies below the bandgap energy of the superconducting state. For example, and not by way of limitation, at a parking temperature of 0.39 K, a cadmium arsenide element has a superconducting state bandgap energy of 0.088 meV. Thus, for a cadmium arsenide element at 0.39 K, the surface state electrons absorb RF-range photons with photon energies below 0.088 meV, and electrons in the bulk superconducting state do not absorb photons with energies below 0.088 meV. It is to be understood that different materials may be characterized by different superconducting state bandgap energies. Accordingly, technologies described herein may be suitable to detection of single photons of various energies.

When a surface state electron absorbs an RF-range photon, the electron is excited into the conduction band of the surface state, creating an electron-hole pair. Due to conservation of energy, the energy absorbed by the electron when absorbing the RF-range photon is insufficient for the electron to migrate into the bulk superconducting state. The electron-hole pair instead couples to a phonon, or quantized vibration, in the bulk portion of the superconductor element. The phonon energy is dissipated into the structure of the bulk semiconductor element as heat. Accordingly, by virtue of the RF-range photon being absorbed by the surface state electron, a temperature of the detection element increases. The increase of the temperature of the detection element is indicative of the total energy of the absorbed RF-range photons, which is a multiple of the individual RF-range photon energy. This allows the number of absorbed RF-range photons to be resolved provided that the RF-frequency of the impinging RF-photons is already known. The RF-frequency of the RF-photons can be measured using an RF spectrum analyzer.

Direct measurement of the temperature of the detection element with sufficient resolution to detect the increase of temperature caused by impingement of the RF-range photon may be difficult. However, as the temperature of the detection element increases, the resistivity of the detection element changes. The change in resistivity of the detection element can be measured by using a micro-ohmmeter to measure the resistance of the detection element. A computing device can be configured to receive measurements of the resistance of the detection element from the micro-ohmmeter. The computing device can further be configured to determine, based upon the resistance measurements, a number of photons absorbed by surface-state electrons of the detection element over a period of time.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
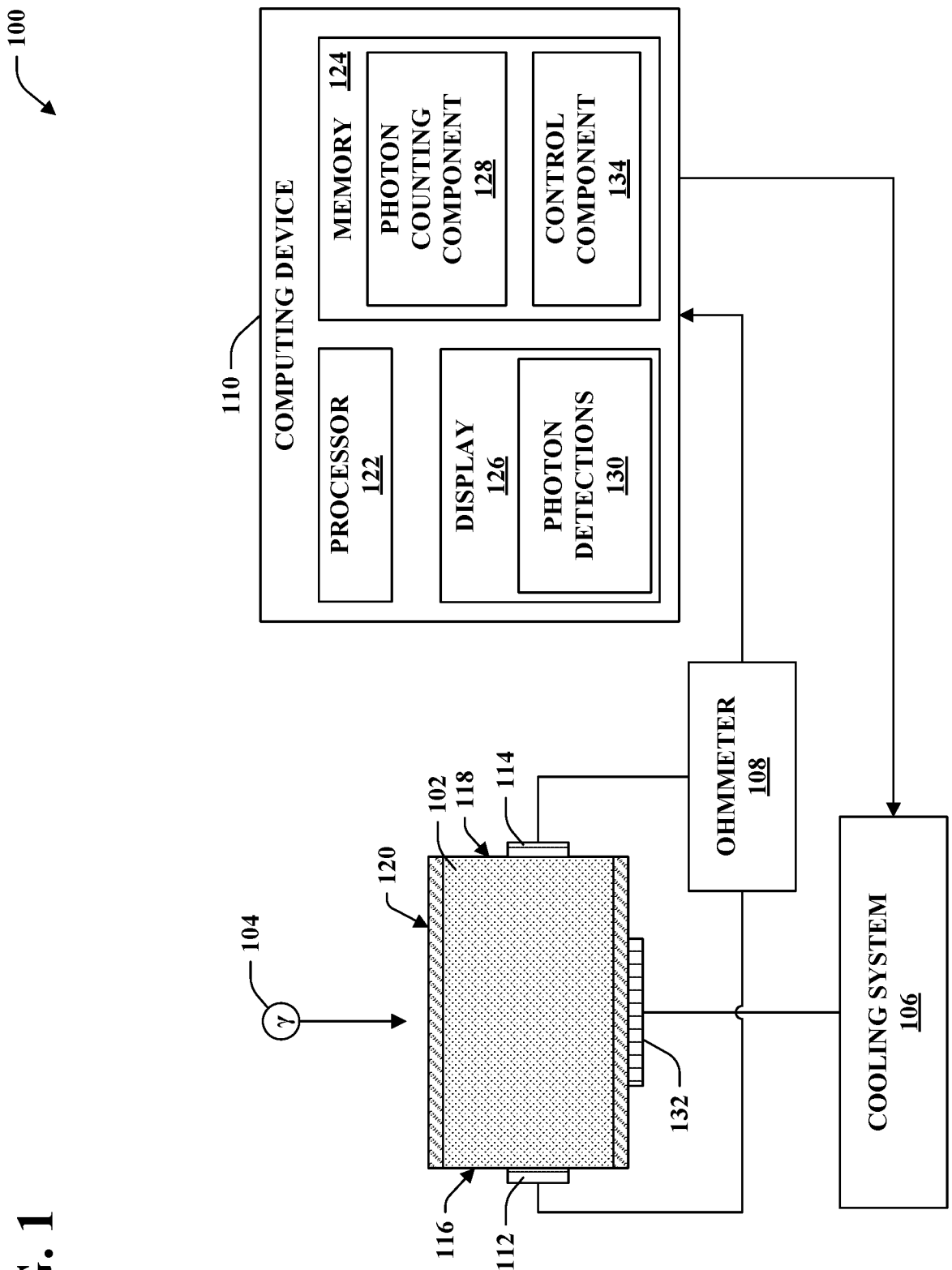
FIG. 1 is a functional block diagram of an exemplary system that facilitates identifying a number of incident photons.

Various technologies pertaining to a system configured to determine a number of incident RF-range photons over a period of time are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Further, as used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. Additionally, as used herein, the term "exemplary" is intended to mean serving as an illustration or example of something, and is not intended to indicate a preference.

With reference to FIG. 1, an exemplary system 100 that facilitates detecting incidence of RF-range photons at a device, and determining a number of the incident photons is illustrated. The system 100 includes an element 102 on which a photon 104 is incident. The system 100 further includes a cooling system 106 that is configured to cool the element 102, an ohmmeter 108 that measures a resistance of the element 102, and a computing device 110 that receives resistance data from the ohmmeter 108. As will be described in greater detail below, the computing device 110 can determine, based upon the resistance data received from the ohmmeter 108 over a period of time, a number of photons that are incident on the element 102 during the period of time.

The element 102 is composed of a material that has a superconducting state below a critical temperature. Stated differently, below the critical temperature, the element 102 has a very low electrical resistivity (e.g., less than 100 megaohm-meters, MΩm, less than 50 MΩm, or less than 30 MΩm). Accordingly, a resistance between two metal contacts 112, 114 on respective opposite sides 116, 118 of the element 102 is substantially lower than for a similarly-sized and -shaped conventional conductor such as copper. The cooling system 106 is configured to cool the element 102 below the critical temperature, so as to cause the element 102 to exhibit the superconducting state.

The material used to form the element 102 is further selected to exhibit a surface state that is distinct from the superconducting state proximal to a surface 120 of the element 102. Stated differently, electrons of the element 102 that are proximal to the surface 120 exhibit different behavior from electrons of the element 102 that are within the remaining bulk of the element 102. In exemplary embodiments, the element 102 is composed of a semimetal that exhibits a surface state characterized by Dirac or Fermi points. By way of example, and not limitation, the element 102 can be composed of a Dirac semimetal or a Weyl semimetal. By way of further example, the element 102 can be composed of cadmium arsenide. In other examples, the element 102 can be composed of any Weyl or Dirac semimetals such as $Na_3Bi$, TaAs, and $SrSi_2$.

Figure 2:
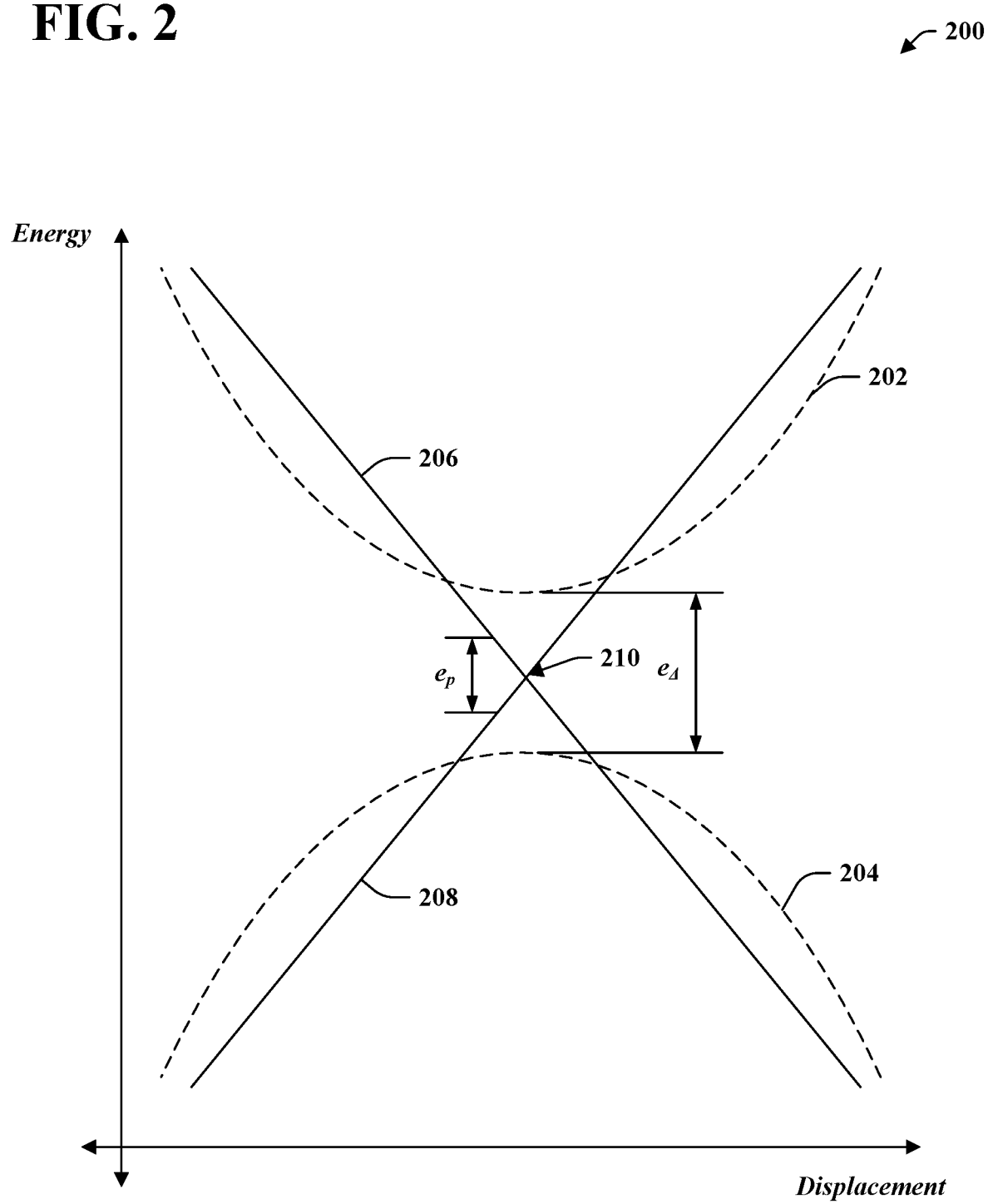
FIG. 2 is an exemplary electron energy band structure diagram.

Electrons that are proximal to the surface 120 or other surface of the element 102 exhibit a surface state in which the electrons are readily able to absorb RF-range photons. By contrast, electrons within the remaining bulk of the element 102 exhibit the superconducting state, and cannot readily absorb RF-range photons. Referring now to FIG. 2, an exemplary electron energy band structure diagram 200 is shown. The diagram 200 depicts a conduction band 202 and a valence band 204 of electrons in the superconducting state of the bulk of the element 102. The diagram 200 further depicts a conduction band 206 and a valence band 208 of electrons in the surface state proximal to the surface 120 of the element 102. The conduction band 202 and the valence band 204 of electrons in the superconducting state are separated by a minimum bandgap energy of $e_A$. The material of the element 102 is selected such that the bandgap energy $e_A$ of the superconducting state exhibited by the bulk of the element 102 is greater than the energy of an RF-range photon that is desirably detected. Accordingly, electrons in the superconducting state are able to absorb photons that have energies above the RF range (e.g., optical-range photons) but are not able to absorb photons with energies in or below the RF range. By way of example, and not limitation, the minimum bandgap energy $e_A$ of the superconducting state of the element 102 can be greater than 80 μeV, greater than 50 μeV, greater than 25 μeV, or greater than 10 μeV. In a non-limiting example, the minimum bandgap energy $e_A$ of the superconducting state of an element composed of cadmium arsenide is about 88 μeV.

By contrast, the conduction band 206 and the valence band 208 of electrons in the surface state meet at a Dirac point 210. At the Dirac point 210, the conduction band 206 and the valence band 208 of electrons in the surface state meet, and photons of substantially any energy can be absorbed. Accordingly, an RF-range photon with energy $e_p$ can be absorbed by electrons proximal to the surface 120 of the element, which electrons exhibit the surface state. When such an RF-range photon is absorbed, an electron-hole pair is formed. The electron of the electron-hole pair is referred to herein as a stimulated electron.

RF-range photons can be absorbed by electrons of the element 102 that exhibit the surface state. However, due to the conservation of energy, a surface state electron that is stimulated by absorption of a photon that has an energy less than the bandgap energy $e_A$ will have an energy lower than the minimum energy of the conduction band 202 of the bulk state of the element 102. Therefore, the stimulated surface state electron will not have sufficient energy to migrate into the bulk of the element 102 (i.e., the portion of the element that exhibits the superconducting state represented by the conduction band 202 and the valence band 204).

A surface state electron stimulated by a photon with an energy below the bandgap energy es couples to phonons in the bulk of the element 102 by way of Coulomb force between the electron and electrons in the bulk of the element 102. In other words, stimulated surface state electrons couple their energy into vibration modes of the bulk of the element 102. The coupling of the stimulated surface state electron to phonons in the bulk of the element 102 causes energy absorbed by the surface-state electron from the RF-range photon 104 to be dissipated into the bulk of the element 102 as heat. This dissipation of the absorbed energy of a stimulated surface state electron causes a temperature of the element 102 to change. The temperature of the element 102 is therefore indicative of a number of sub-bandgap-energy photons incident on the surface 120 and absorbed by the surface state electrons.

Figure 3:
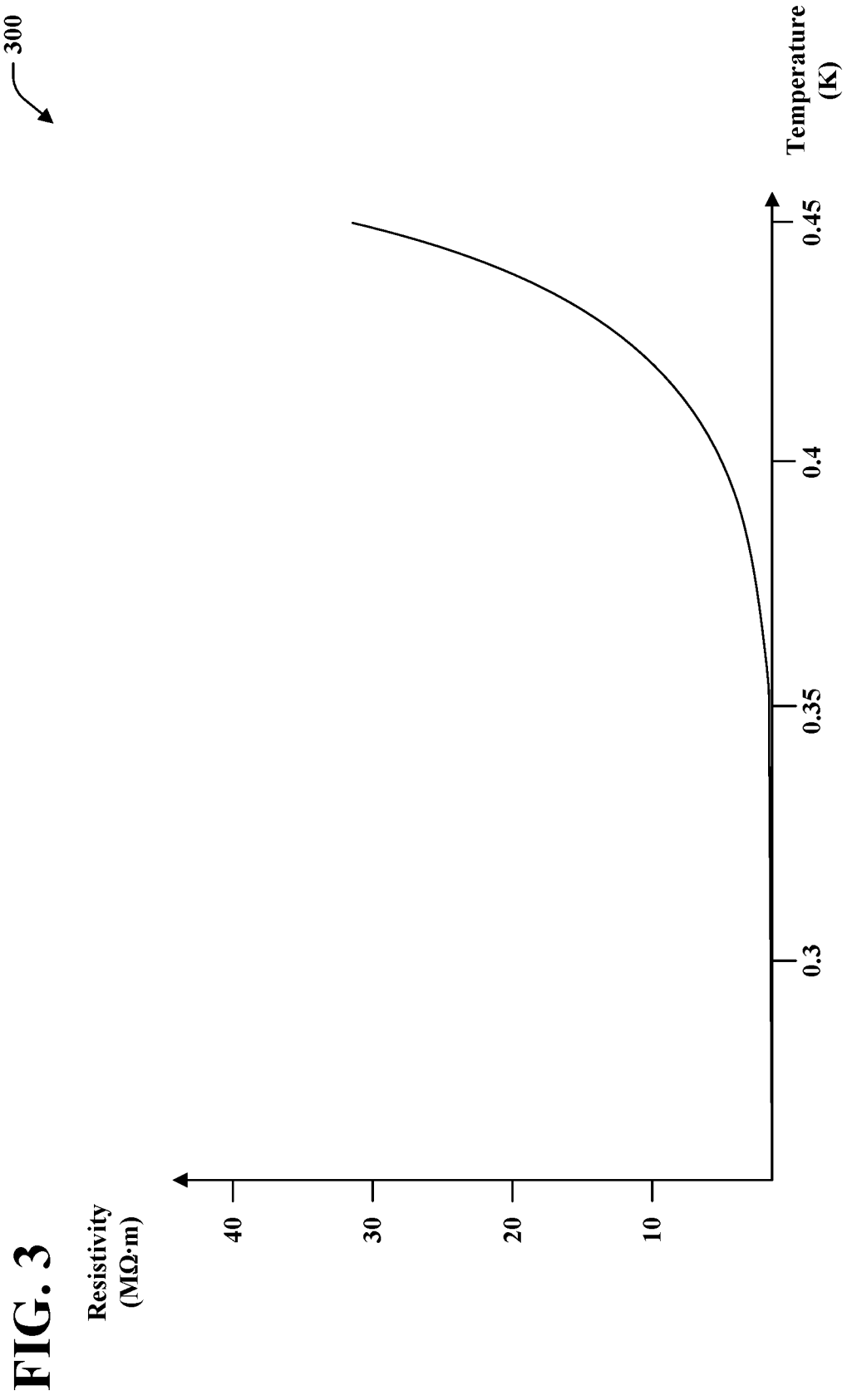
FIG. 3 is an exemplary plot of resistivity of a bulk cadmium arsenide detection element versus temperature.

The increase in temperature of the element 102 due to absorption of a sub-bandgap-energy photon (e.g., an RF-range photon) by a surface state electron of the element 102 can be determined based upon the resistivity of the element 102. The resistivity of the element 102 changes as the temperature of the element 102 changes. Referring now to FIG. 3, an exemplary plot 300 of bulk resistivity of a cadmium arsenide element, in megaohm-meters (MΩ·m), against temperature in Kelvin (K) is shown. The bulk resistivity of cadmium arsenide is very low in a superconducting state that exists below about 0.35 K relative to the resistivity of cadmium arsenide above a superconducting transition temperature of about 0.4 K. As the temperature of a cadmium arsenide element increases to above about 0.4 K, the resistivity of the element increases non-linearly.

Referring once again to FIG. 1, the ohmmeter 108 is configured to measure resistance of the element 102 by way of the contacts 112, 114 that are positioned on respective opposite sides 116, 118 of the element 102. The ohmmeter 108 outputs resistance data to the computing device 110, the resistance data being indicative of the resistance of the element 102 between the contacts 112, 114 during a detection period. The detection period is a period during which impingement of photons on the element 102 is desirably detected. It is to be understood, however, that the ohmmeter 108 can output the resistance data continuously, such that the resistance data is indicative of electrical resistance of the element 102 both during the detection period and outside the detection period.

The computing device 110 is configured to receive the resistance data from the ohmmeter, and to output an indication of a number of photons incident on the element 102 that have an energy less than the superconducting bandgap energy es of the superconducting state of the element 102. The computing device 110 includes a processor 122, memory 124 that stores instructions that are executed by the processor 122, and a display 126. It is to be understood that in some embodiments, functionality of the computing device 110 can be carried out by a suitably configured field-programmable gate array (FPGA), application-specific integrated circuit (ASIC), microcontroller, or other hardware logic component.

The memory 124 includes a photon counting component 128. The photon counting component 128 is configured to compute, based upon the resistance data output by the ohmmeter 108, a number of photons incident on the element 102. As noted above, photons having energies above the bandgap energy of the superconducting state do not have a substantial effect on the temperature of the element 102 and so do not have a significant effect on the resistivity of the element 102. Therefore, the photon counting component 128 computes a number of photons incident on the element 102 that have energies below the bandgap energy es of the superconducting state of the bulk of the element 102.

The photon counting component 128 computes the number of sub-bandgap-energy photons incident on the element 102 based upon an increase in the resistance of the element 102 over the detection period. The resistance of the element 102 is a function of the resistivity of the element 102 and the geometry of the element 102, which geometry is fixed. Therefore, the resistance of the element 102 indicated by the resistance data output by the ohmmeter 108 is itself indicative of the resistivity of the element 102. The resistivity of the element 102 is in turn indicative of a temperature of the element 102, and therefore change in the resistance of the element 102 can indicate minute changes in the temperature of the element 102 that are caused by incidence of sub-bandgap-energy photons at the surface 120.

In an exemplary embodiment, the photon counting component 128 receives, from the ohmmeter 108, resistance data that is indicative of resistance of the element 102 during a detection period. The photon counting component 128 can determine an initial resistance of the element 102 at the start of the detection period based upon the resistance data. The photon counting component 128 can then determine a final resistance of the element 102 at the end of the detection period based upon the resistance data. The photon counting component 128 can then compute the difference between the final resistance of the element 102 and the initial resistance of the element 102 to identify a resistance change value. In the exemplary embodiment, the photon counting component 128 can compute a number of sub-bandgap-energy photons incident on the element 102 based upon the resistance change value. By way of example, and not limitation, the photon counting component 128 can compute a change in resistivity of the element 102 based upon the resistance change value and a known geometry of the element 102 (e.g., stored in the memory 124 and accessible by the photon counting component 128). The photon counting component 128 can then determine a number of incident sub-bandgap-energy photons based upon the computed resistivity. In an exemplary embodiment, the photon counting component 128 can determine the number of incident sub-bandgap-energy photons based further upon an RF frequency of the sub-bandgap-energy photons, which RF frequency can be determined using a spectrum analyzer (not shown). Responsive to determining the number of incident sub-bandgap-energy photons, the photon counting component 128 can output the number of incident sub-bandgap-energy photons to the display 126 as photon detections 130.

The cooling system 106 can be configured to cool the element 102 to a parking temperature (e.g., prior to incidence of photons) near a superconducting transition point (e.g., a temperature near which electrons in the bulk of the element 102 begin to transition from a superconducting state to a non-superconducting state). By way of example, and with reference to FIG. 3, a plot 300 of bulk resistivity of an exemplary cadmium arsenide element (e.g., configured according to the element 102) is shown. As indicated in the plot 300, resistivity of the cadmium arsenide element is very low (e.g., less than 1 MΩ·m) below a temperature of about 0.35 K. Resistivity of the cadmium arsenide element begins to substantially increase with increasing temperature above a temperature of about 0.4 K. Above a temperature of about 0.45 K, the cadmium arsenide is no longer in a superconducting state. Accordingly, in embodiments wherein the element 102 is formed from cadmium arsenide, the cooling system 106 can be configured to cool the element 102 to a parking temperature of greater than or equal to 0.35 K and less than or equal to 0.45 K. When a cadmium arsenide element has a temperature between 0.35 K and 0.45 K, an increase in temperature of the element due to incidence of a single photon can be on the order of micro-ohms, depending upon geometry of the element. Thus, in embodiments wherein the element 102 is formed from cadmium arsenide, the cooling system 106 can be configured to cool the element 102 to a parking temperature between and including 0.35 to 0.45 K. It is to be understood that elements formed from other materials may be characterized by different resistivity-temperature profiles, and thus a suitable parking temperature for an element formed from a material other than cadmium arsenide may be selected by the control component 134.

In some embodiments, the cooling system 106 can be configured to cease cooling of the element 102 during the detection period. By way of example, and not limitation, the system 100 can include a cooling contact 132 that can be selectively coupled to the element 102. The memory 124 can further include a control component 134 that is configured to control operation of the cooling system 106. In such embodiments, the control component 134 controls the cooling system 106 to decouple the cooling contact 132 from the element 102 during the detection period. When the cooling contact 132 is decoupled from the element 102, incident sub-bandgap energy photons are able to increase the temperature of the element 102 without the cooling system 106 continuing to cool the element 102. In such embodiments, a change in temperature that is observable in a change in electrical resistance of the element 102 can be directly indicative of absorption of the sub-bandgap-energy photon 104 by surface state electrons of the element 102.

In other embodiments, the cooling system 106 can be configured to continue cooling of the element 102 to a set parking temperature during the detection period. In these embodiments, the photon counting component 128 can be configured to compute a number of incident sub-bandgap-energy photons in a manner that is robust to changes in temperature due to cooling of the element 102 by the cooling system 106. By way of example, and not limitation, the photon counting component 128 can be configured to identify instances of resistance increase in the resistance data output by the ohmmeter 108. The photon counting component 128 determines that a sub-bandgap-energy photon was incident on the element 102 responsive to identifying an instance of resistance increase in the resistance data. In an exemplary embodiment, the photon counting component 128 determines a number of resistance increases for the element 102 (e.g., above a threshold resistance increase value, to mitigate the effects of noise) based upon the resistance data output by the ohmmeter 108 during the detection period.

In another non-limiting example, prior to computing the number of sub-bandgap-energy photons incident on the element 102, the photon counting component 128 can compute a temperature profile for the element 102 based upon the resistance data. The temperature profile is indicative of the temperature of the element 102 over the detection period. In embodiments wherein the cooling system 106 continues to cool the element 102 during the detection period, the temperature of the element 102 at any time during the detection period depends upon both a number of sub-bandgap-energy photons incident on the element 102 and heat transfer between the element 102 and the cooling system (e.g., by way of the cooling contact 132). The photon counting component 128 can be configured to compute the number of incident sub-bandgap-energy photons based upon the temperature profile and a thermodynamic model of a system including the element 102 and the cooling system 106. The thermodynamic model is representative of heat transfer effects between the element 102 and a cooling medium employed by the cooling system 106 to cool the element 102 (e.g., the cooling contact 132, or a fluid medium that surrounds the element 102 and that is cooled by the cooling system 106).

As noted above, the conduction band 206 and valence band 208 of electrons in the surface state meet at a Dirac point 210. The surface state electrons are capable of absorbing both RF-range photons and higher-energy photons, such as optical photons. However, when photons with energy above the bandgap energy $e_A$ (e.g., optical photons) are absorbed by surface state electrons, the electrons have sufficient energy to migrate into the conduction band of the bulk of the element 102 in the superconducting state. Further, the surface state of the element 102 has a small absorption cross-section relative to the bulk superconducting state, and thus photons with energies above the bandgap energy es are more likely to be absorbed by electrons in the bulk superconducting state, thereby stimulating bulk electrons into the conduction band 202. These electrons in the conduction band 202 of the bulk superconducting state are then swept out of the element 102 by way of the electrical contacts 112, 114 due to superconductivity of the electrons in the bulk of the element 102. Thus, photons with energy above the bandgap energy es generally do not have sufficient time to couple to phonons of the bulk of the element 102, and thereby do not substantially affect the temperature of the element 102. Accordingly, a number of incident photons determined by the photon counting component 128 can fail to include incident optical photons, which may be desirably excluded from a count of the incident photons.

Whereas an RF photon readily passes through the superconducting bulk of the element 102 and can be absorbed by surface state electrons proximal to surfaces (e.g., the surface 120) of the element 102, the RF photon is not certain to be absorbed by such an electron. There is a non-unity probability that, as an RF-range photon passes through the element 102, the RF-range photon will be absorbed by a surface state electron of the element 102. In order to increase the likelihood of absorption and detection of an RF photon, the system 100 can include features that are configured to increase the likelihood of detecting an RF photon.

Figure 4:
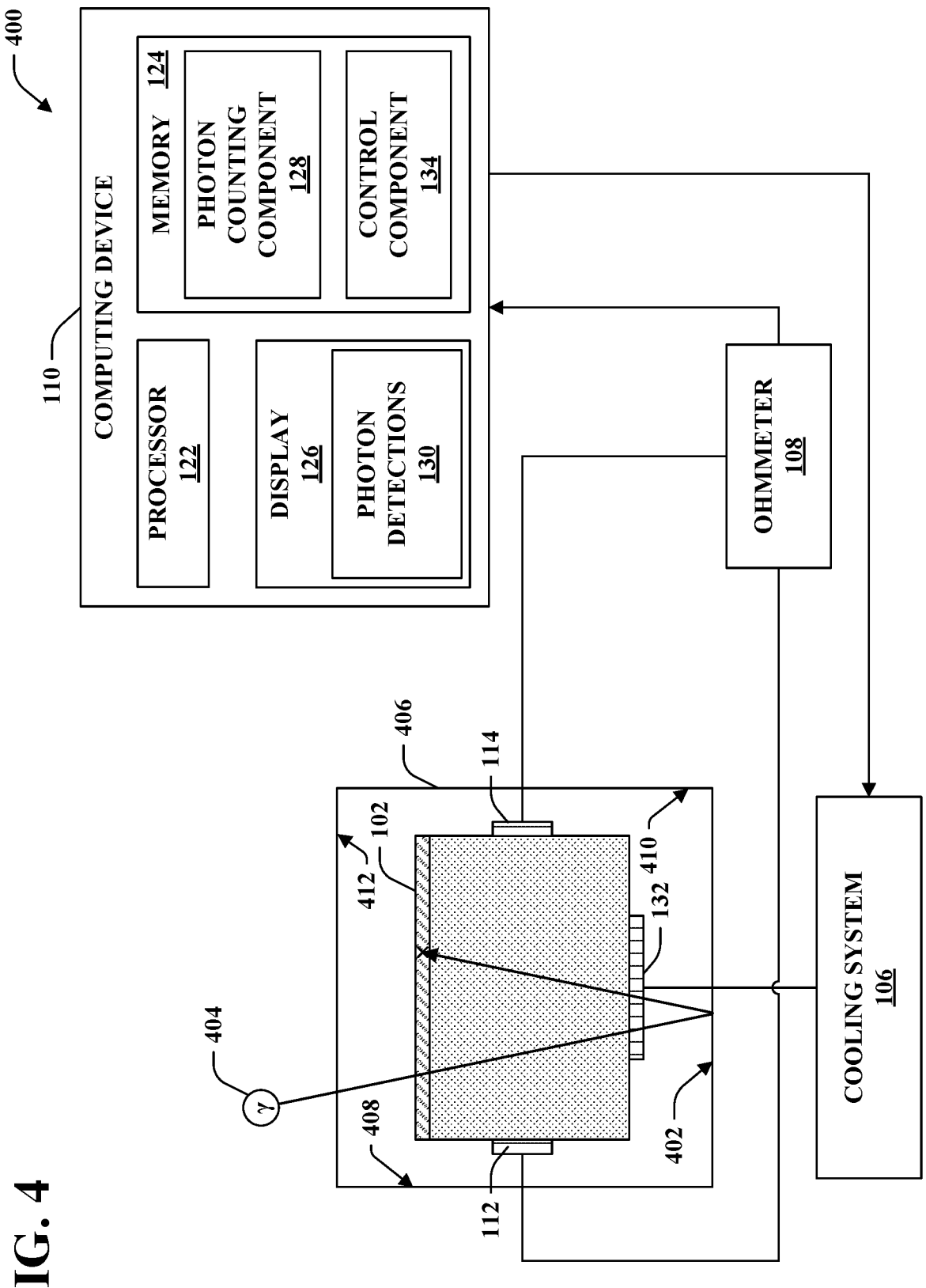
FIG. 4 is a diagram of another exemplary system for identifying a number of incident photons.

In some embodiments, a likelihood of detecting an impinging sub-bandgap-energy photon can be improved by reflecting non-absorbed photons back through the element 102. By way of example, and referring now to FIG. 4, an exemplary system 400 that facilitates reflecting non-absorbed photons back through the element 102 is shown. The system 400 includes the element 102, the cooling system 106, the ohmmeter 108, and the computing device 110. The system 400 is configured similarly to the system 100, and further includes a reflecting surface 402. The reflecting surface 402 is configured to reflect a photon 404 that passes through the element 102 back through the element 102. In exemplary embodiments the reflecting surface 402 can be a reflecting plate. In other exemplary embodiments, the reflecting surface 402 can be a surface of a chamber 406 within which the element 102 is positioned. The chamber 406 can include a plurality of additional surfaces, e.g., surfaces 408-412, that are each configured to reflect incident photons such that the photons are directed back toward the element 102. In exemplary embodiments, the surfaces 402, 408-412 can be configured to reflect photons that have energies within a range of energies that are desirably detected by the system 400.

Figure 5:
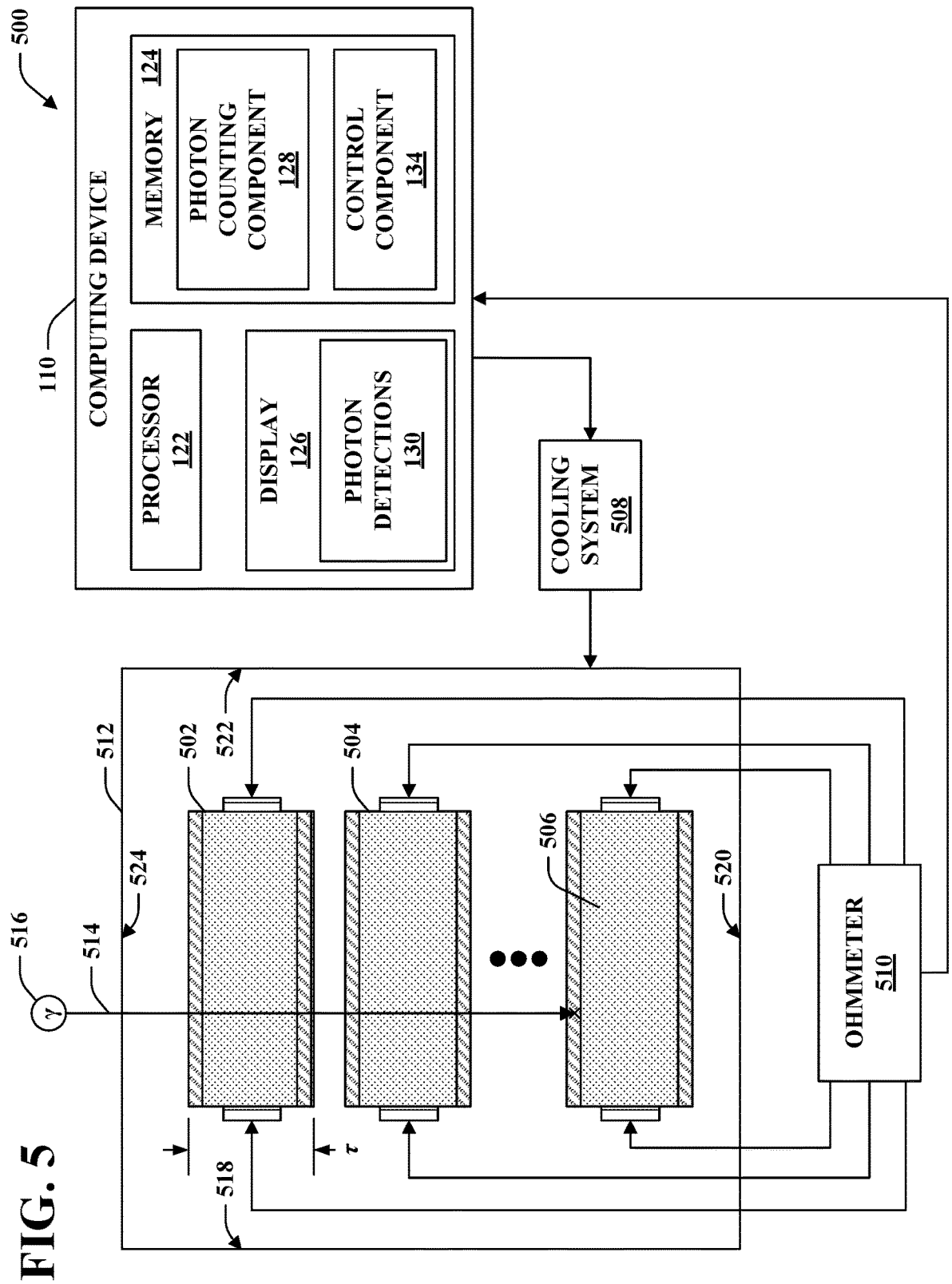
FIG. 5 is a diagram of still another exemplary system for identifying a number of incident photons.

In other embodiments, a likelihood of detecting an impinging RF photon can be improved by employing multiple detection elements configured similarly to the element 102 of the system 100. For example, and referring now to FIG. 5, a system 500 is shown, wherein the system 500 includes a plurality of n elements 502-506, where n is a positive integer. The system 500 further includes a cooling system 508, an ohmmeter 510, and the computing device 110. The elements 502-506 of the system 500 are configured in similar fashion to the element 102. By way of example, and not limitation, the elements 502-506 can be composed of a Dirac or Weyl semimetal. Each of the elements 502-506 exhibits a bulk superconducting state when cooled below a superconducting threshold temperature. The elements 502-506 further exhibit a surface state that is characterized by a Dirac cone, such that there is no bandgap between the valence band and the conduction band for electrons in the surface state.

The cooling system 508 is configured to cool the elements 502-506 below the superconducting threshold temperature. In various embodiments, the elements 502-506 can be positioned within a chamber 512, and the cooling system 508 can be configured to cool the ambient temperature within the chamber 512 below a superconducting threshold temperature of the elements 502-506. In other embodiments, the cooling system 508 can be configured to cool the elements 502-506 by way of contact cooling. For instance, the cooling system 508 can be configured to cool each of the elements 502-506 by way of respective cooling contacts (not shown) that are permanently or selectively coupled to the elements 502-506. In these embodiments, the chamber 512 can be omitted from the system 500.

In the system 500, the ohmmeter 510 is configured to output resistance data that is indicative of resistance of each of the elements 502-506. In exemplary embodiments, the ohmmeter 510 can be configured to have a plurality of n independent channels, wherein each of the channels is configured for measurement of resistance of a single one of the n elements 502-506. The ohmmeter 510 can output the resistance data to the computing device 110 such that the resistance data includes distinct resistance values representative of resistance of each of the elements 502-506.

The elements 502-506 can be arranged in a stack. Stated differently, the elements 502-506 can be aligned with one another along at least one direction. The stack of elements 502-506 can then be oriented along a direction 514 along which a desirably detected photon 516 is expected to travel. When the photon 516 impinges on a first element in the stack (e.g., the element 502), there is a non-zero, non-unity probability that the photon 516 will be absorbed by electrons of the element 502 that exhibit the surface state described in greater detail above. If the photon 516 is not absorbed by a surface state electron, the photon passes through the element 502 and impinges on the next element 504. As the photon 516 impinges on the next element 504, there is non-zero, non-unity probability that the photon 516 will be absorbed by surface state electrons of the element 504. Thus, a probability that the sub-bandgap-energy photon 516 will be absorbed by surface state electrons of one of the elements 502-506 is dependent on a number of the elements 502-506 in the system 500. In general, all else being equal, a greater number of the elements 502-506 along the direction of travel 514 of the photon 516 yields a greater absorption cross-section with respect to the photon 516.

In various embodiments, the elements 502-506 can be configured to have small thickness along the direction 514 of travel of the photon 516 (e.g., a thickness t shown in FIG. 5) to facilitate inclusion of a greater number of elements within a given space. Since desirably detected sub-bandgap-energy photons will be absorbed only by surface state electrons of the elements 502-506 and not by electrons in the bulk superconducting state, a reduction in thickness of each element and a corresponding increase in a number of the elements 502-506 provides a greater absorption cross-section with respect to the sub-bandgap-energy photon 516.

In some embodiments, the likelihood of detecting an impinging sub-bandgap-energy photon can be improved by employing the multiple detection elements 502-506 of the system 500 and a photon reflecting apparatus such as the reflecting surface 402 of the system 400, or the chamber 406 of reflecting surfaces 402, 408-412 of the system 400. By way of example, and not limitation, in embodiments wherein the detection elements 502-506 are positioned in the chamber 512, the chamber 512 can include a plurality of interior surfaces 518-524. One or more of the surfaces 518-524 can be configured to reflect incident photons, such that the photons are directed back through the chamber 512, potentially impinging on one or more of the elements 502-506 again.

In various exemplary embodiments, the systems 100, 400, 500 can be employed in a quantum computer that is configured to operate on superconducting transmon qubits. In such embodiments, functionality described herein as being performed by the computing device 110 can instead be performed by a similarly-configured hardware logic component such as an ASIC, an FPGA, a microcontroller, or the like. Furthermore, in these embodiments, photon detection data can be output to other components of a quantum computer in which the systems 100, 400, 500 are configured to operate to facilitate operation of these other components based upon states of the superconducting transmon qubits.

Figure 6:
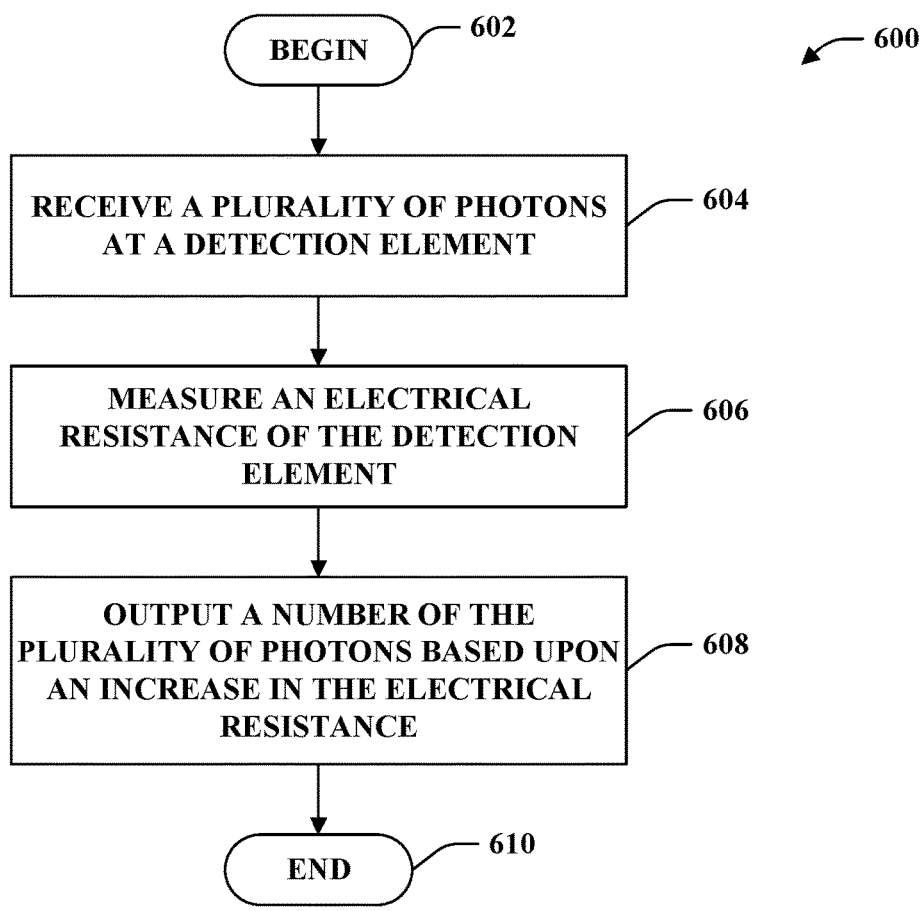
FIG. 6 is a flow diagram that illustrates an exemplary methodology for resolving a number of photons incident on a detector.

FIG. 6 illustrates an exemplary methodology 600 relating to resolving a number of RF-range photons incident on a detection element. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement a methodology described herein.

Moreover, the acts described herein may be computer-executable instructions that can be implemented by one or more processors and/or stored on a computer-readable medium or media. The computer-executable instructions can include a routine, a sub-routine, programs, a thread of execution, and/or the like. Still further, results of acts of a methodology can be stored in a computer-readable medium, displayed on a display device, and/or the like.

The methodology 600 begins at 602, and at 604 a plurality of photons (e.g., RF-range photons) are received at a detection element. In exemplary embodiments, the detection element is characterized by a surface state that exhibits a Dirac cone and a bulk superconducting state that exhibits a bandgap energy that is greater than the energy of RF-range photons. By way of example, and not limitation, the detection element can be formed from a Dirac semimetal or a Weyl semimetal. In exemplary embodiments, the detection element can be configured similarly to any of the detection elements 102, 502-506 described above. When photons that have energies below the bandgap energy of the bulk superconducting state impinge on the detection element, the photons can be absorbed by electrons characterized by the surface state by virtue of the surface state exhibiting the Dirac cone. When the photons are absorbed by the surface state electrons, the photons couple to vibration modes, or phonons, of the detection element. This phonon coupling yields an increase in the temperature of the detection element that in turn causes a resistivity of the detection element to increase. At 606, an electrical resistance of the detection element is measured through the bulk of the detection element during a detection period in which the plurality of photons are received at the detection element. When the resistivity of the detection element increases, the resistance measured at 606 will increase. Accordingly, a number of the photons received at the detection element at 604 can be determined based upon the increase in the electrical resistance of the detection element. Hence, at 608, a number of the plurality of photons is output based upon an increase in the electrical resistance measured at 606, and the methodology 600 ends 610.

Figure 7:
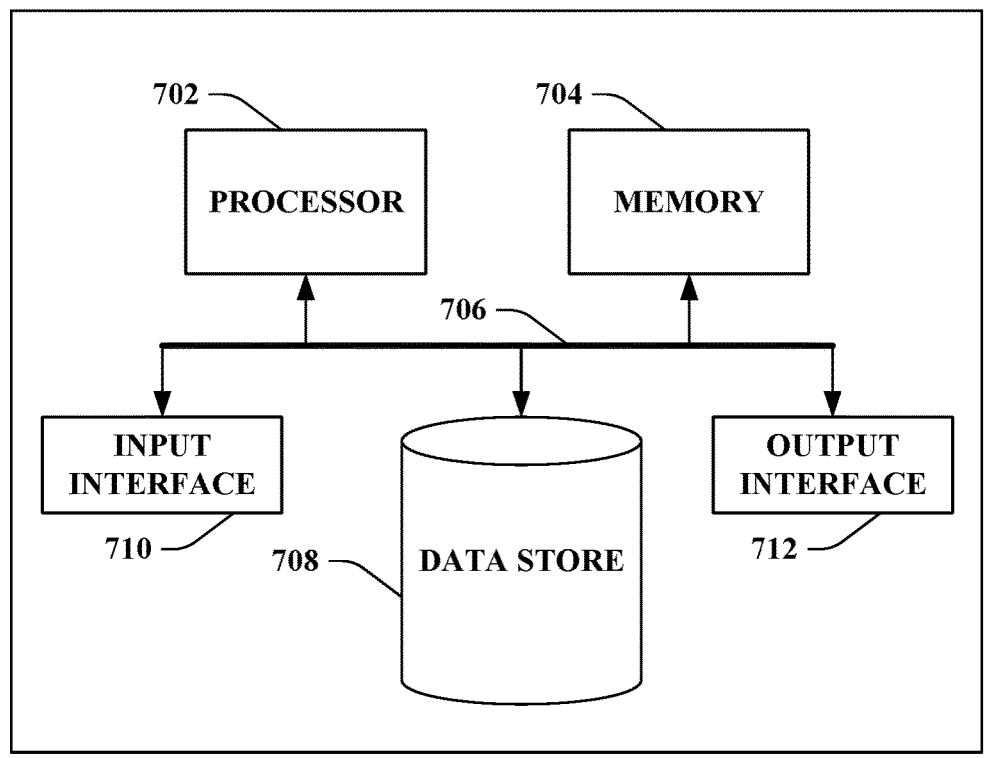
FIG. 7 is an exemplary computing system.

Referring now to FIG. 7, a high-level illustration of an exemplary computing device 700 that can be used in accordance with the systems and methodologies disclosed herein is illustrated. For instance, the computing device 700 may be used as the computing device 110 in any of the systems 100, 400, 500. By way of another example, the computing device 700 can be used in a system that interfaces between a quantum computing system and the computing device 110. The computing device 700 includes at least one processor 702 that executes instructions that are stored in a memory 704. The instructions may be, for instance, instructions for implementing functionality described as being carried out by one or more components discussed above or instructions for implementing one or more of the methods described above. The processor 702 may access the memory 704 by way of a system bus 706. In addition to storing executable instructions, the memory 704 may also store resistance data pertaining to electrical resistance of one or more detection elements, photon detection data, or data indicative of dimensions of a detection element.

The computing device 700 additionally includes a data store 708 that is accessible by the processor 702 by way of the system bus 706. The data store 708 may include executable instructions, resistance data, photon detection data, detection element dimensions, etc. The computing device 700 also includes an input interface 710 that allows external devices to communicate with the computing device 700. For instance, the input interface 710 may be used to receive instructions from an external computer device, from a user, etc. The computing device 700 also includes an output interface 712 that interfaces the computing device 700 with one or more external devices. For example, the computing device 700 may display text, images, etc. by way of the output interface 712.

It is contemplated that the external devices that communicate with the computing device 700 via the input interface 710 and the output interface 712 can be included in an environment that provides substantially any type of user interface with which a user can interact. Examples of user interface types include graphical user interfaces, natural user interfaces, and so forth. For instance, a graphical user interface may accept input from a user employing input device(s) such as a keyboard, mouse, remote control, or the like and provide output on an output device such as a display. Further, a natural user interface may enable a user to interact with the computing device 700 in a manner free from constraints imposed by input device such as keyboards, mice, remote controls, and the like. Rather, a natural user interface can rely on speech recognition, touch and stylus recognition, gesture recognition both on screen and adjacent to the screen, air gestures, head and eye tracking, voice and speech, vision, touch, gestures, machine intelligence, and so forth.

Additionally, while illustrated as a single system, it is to be understood that the computing device 700 may be a distributed system. Thus, for instance, several devices may be in communication by way of a network connection and may collectively perform tasks described as being performed by the computing device 700.

Various functions described herein can be implemented in hardware, software, or any combination thereof. If implemented in software, the functions can be stored on or transmitted over as one or more instructions or code on a computer-readable medium. Computer-readable media includes computer-readable storage media. A computer-readable storage media can be any available storage media that can be accessed by a computer. By way of example, and not limitation, such computer-readable storage media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk, and blu-ray disc (BD), where disks usually reproduce data magnetically and discs usually reproduce data optically with lasers. Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of communication medium. Combinations of the above should also be included within the scope of computer-readable media.

Alternatively, or in addition, the functionality described herein can be performed, at least in part, by one or more hardware logic components. For example, and without limitation, illustrative types of hardware logic components that can be used include FPGAs, ASICs, Application-specific Standard Products (ASSPs), System-on-a-chip systems (SOCs), Complex Programmable Logic Devices (CPLDs), etc.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A detector comprising:
   an element that comprises a surface and a bulk portion that are formed of a same material, wherein electrons of the element exhibit a surface state proximal to the surface and a bulk state within the bulk portion that differs from the surface state, wherein a radio frequency (RF)-range photon that impinges on the surface of the element is absorbed by an electron exhibiting the surface state thereby causing heat to dissipate into the bulk portion of the element;
   an ohmmeter that is configured to output a signal indicative of a resistance of the bulk portion of the element, where the resistance of the bulk portion of the element is based upon the heat dissipated into the bulk portion of the element; and
   a hardware logic component that receives the signal from the ohmmeter and, based upon the resistance, outputs an indication that the RF-range photon impinged on the surface.

2. The detector of claim 1, wherein the element is composed of a Dirac semimetal.

3. The detector of claim 2, wherein the Dirac semimetal is cadmium arsenide.

4. The detector of claim 1, wherein the element is composed of a material selected from the list consisting of:
   $Na_3Bi$;
   TaAs; and
   $SrSi_2$.

5. The detector of claim 1, wherein the element is composed of a Weyl semimetal.

6. The detector of claim 1, wherein the electron that absorbs the RF-range photon couples to a phonon of the bulk portion of the element subsequent to absorption of the photon.

7. The detector of claim 6, wherein the coupling of the electron to the phonon causes a heat to dissipate to the bulk portion of the element.

8. The detector of claim 1, further comprising a cooling device, the cooling device configured to cool the element such that the bulk state is a superconducting state that exhibits a bandgap.

9. The detector of claim 8, wherein the cooling device is configured to cool the element to a temperature between 0.3 Kelvin and 0.45 Kelvin.

10. The detector of claim 8, wherein the bandgap energy is greater than 80 μeV.

11. The detector of claim 8, wherein the RF-range photon has an energy less than the bandgap energy.

12. The detector of claim 1, further comprising a reflector that is configured to cause a second RF-range photon that passes through the element to be directed back toward the element.

13. The detector of claim 1, wherein the element is a first element, the detector further comprising a second element that is configured such that a second RF-range photon that passes through the first element impinges on the second element.

14. The detector of claim 13, wherein the ohmmeter is further configured to output a second signal that is indicative of resistance of the second element, the hardware logic component further configured to receive the second signal and to output an indication that the second RF-range photon impinged on the second element based upon the resistance of the second element.

15. A method, comprising:
    receiving a plurality of RF-range photons at a detection element during a detection period, the detection element comprising a surface and a bulk portion that are formed of a same material, where first electrons proximal to the surface exhibit a surface state and second electrons in the bulk portion exhibit a bulk state, wherein the plurality of RF-range photons are absorbed by the first electrons, and further wherein absorption of the RF-range photons causes heat to be dissipated into the bulk portion of the detection element;
    measuring an electrical resistance of the detection element during the detection period to generate resistance data, the resistance data indicative of the electrical resistance of the detection element during the detection period, wherein the electrical resistance of the detection element is dependent upon the heat dissipated into the bulk portion of the detection element; and
    outputting, based upon an increase in the electrical resistance of the detection element during the detection period, a number of the plurality of photons received at the detection element.

16. The method of claim 15, wherein the surface state is characterized by a Dirac cone.

17. The method of claim 15, wherein the bulk state is a superconducting state.

18. The method of claim 17, wherein the superconducting state is characterized by a non-zero bandgap energy.

19. A system for detecting sub-optical-wavelength photons, comprising:
    an element that comprises a surface and a bulk portion that are formed of a same material, wherein electrons of the element exhibit a surface state proximal to the surface and a bulk state within the bulk portion, the bulk state being characterized by a bandgap energy, wherein a photon that impinges on the surface of the element is absorbed by an electron exhibiting the surface state, the photon having an energy less than the bandgap energy of the bulk state, and further where absorption of the electron exhibiting the surface state causes heat to be dissipated into the bulk portion of the element;
    an ohmmeter that is configured to output a signal indicative of a resistance of the bulk portion of the element, wherein the resistance is based upon the heat dissipated into the bulk portion of the element; and
    a hardware logic component that receives the signal from the ohmmeter and, based upon the resistance, outputs an indication that the photon impinged on the surface.

20. The system of claim 19, wherein the element is formed from a Dirac semimetal or a Weyl semimetal.

* * * * *